United States Patent
Lin

(10) Patent No.: US 7,490,788 B2
(45) Date of Patent: Feb. 17, 2009

(54) GRINDING MACHINE WITH SPHERICAL GRINDING SURFACE

(75) Inventor: Mong-Tung Lin, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 94 days.

(21) Appl. No.: 11/309,313

(22) Filed: Jul. 25, 2006

(65) Prior Publication Data

US 2007/0102548 A1    May 10, 2007

(30) Foreign Application Priority Data

Nov. 10, 2005   (CN)  .................... 2005 1 0101204

(51) Int. Cl.
  *B02C 19/00*   (2006.01)
(52) U.S. Cl. ........................ 241/66; 241/199.7
(58) Field of Classification Search ............. 241/65, 241/66, 67, 199.7, 199.12, 199.5, 252, 253
See application file for complete search history.

(56) References Cited

U.S. PATENT DOCUMENTS

| 112,213 | A | * | 2/1871 | Brady ..................... 241/114 |
| 527,986 | A | * | 10/1894 | Howe ..................... 241/212 |
| 745,416 | A | * | 12/1903 | Breakell ................ 241/199.7 |
| 832,253 | A | * | 10/1906 | Goldman .............. 241/199.7 |
| 3,809,322 | A | * | 5/1974 | Hirosawa ............... 241/46.17 |
| 3,976,253 | A | * | 8/1976 | Medicus .................. 241/167 |
| 4,050,637 | A | * | 9/1977 | Eirich et al. ............... 241/56 |
| 6,605,238 | B2 | | 8/2003 | Nguyen et al. |
| 2003/0077478 | A1 | | 4/2003 | Dani et al. |

* cited by examiner

*Primary Examiner*—Mark Rosenbaum
(74) *Attorney, Agent, or Firm*—Andrew C. Cheng

(57) ABSTRACT

An exemplary grinding machine includes a grinding unit and a receiving unit. The grinding unit includes a rotor, a first spindle, and a first driver unit connected in series. The first spindle has a first end coupled to the rotor. The first driver unit is coupled to an opposite second end of the first spindle and configured for driving the rotor to rotate relative to a first axis. The receiving unit includes a container configured for receiving the rotor therein. The container has an inner spherical grinding surface defining a central second axis. The first axis is parallel to and spaced from the second axis.

13 Claims, 2 Drawing Sheets

GRINDING MACHINE WITH SPHERICAL GRINDING SURFACE

FIELD OF THE INVENTION

The present invention relates to grinding machines, and more particularly to a grinding machine for grinding for example a thermal interface material.

DESCRIPTION OF RELATED ART

Electronic components such as semiconductor chips are becoming progressively smaller, while at the same time heat dissipation requirements are increasing. Commonly, a thermal interface material (hereafter called TIM) is applied between the electronic component and a heat sink in order to fill air space therebetween thereby promoting efficient heat transfer. Nevertheless, the thermal conductivity of TIM is typically in the range of 0.15 W/mK (watts/mill Kelvin) to 0.30 W/mK.

TIMs are generally made of matrix material and thermally conductive fillers. The matrix material is selected from the group consisting of organic silicon and multi-hydroxyl radical esters. The fillers are chosen from the group consisting of metal powder, boron nitride (BN), alumina ($Al_2O_3$), and zinc oxide (ZnO). With the development of the nano-technology, nano-fillers have become widely used in TIMs.

However, nano-particles may easily conglomerate under the influence of Van der Waal's forces. Therefore, the nano-fillers and the matrix material of the conventional TIM are difficult to mix uniformly. Generally, the TIM with high content of the nano-fillers has a relatively high thermal conductivity. However, the greater the number of the filler-particles in the TIM, the higher viscosity of the TIM. As a result the fillers and the matrix material are more difficult to mix uniformly. An external force is usually used to spread the fillers through the matrix material uniformly. One method of doing this is grinding. However, grinding cannot sufficiently disperse the nano-fillers in a high viscosity TIM.

What is needed, therefore, is a grinding machine that can mix the matrix material uniformly with the nano-fillers having larger mass than that of the matrix material.

SUMMARY OF THE INVENTION

In a preferred embodiment, a grinding machine includes a grinding unit and a receiving unit. The grinding unit includes a rotor, a first spindle, and a first driver unit connected in series. The first spindle has a first end coupled to the rotor. The first driver unit is coupled to an opposite second end of the first spindle and configured for driving the rotor to rotate relative to a first axis. The receiving unit includes a container configured for receiving the rotor therein. The container has an inner spherical grinding surface defining a central second axis. The first axis is parallel to and spaced from the second axis.

In another preferred embodiment, a grinding machine includes a grinding member, a first driving unit, a container, and a second driving unit. The grinding member is configured for driving the grinding member to rotate relative to a first axis in a first direction. The container is configured for receiving the grinding member therein. The second driving unit is configured for driving the container to rotate relative to a second axis in a second direction opposite to the first direction. The second axis is parallel to and spaced from the first axis.

Other advantages and novel features will become more apparent from the following detailed description of the present grinding machine when taken in conjunction with the accompanying drawings.

BRIEF DESCRIPTION OF THE DRAWINGS

Many aspects of the grinding machine can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
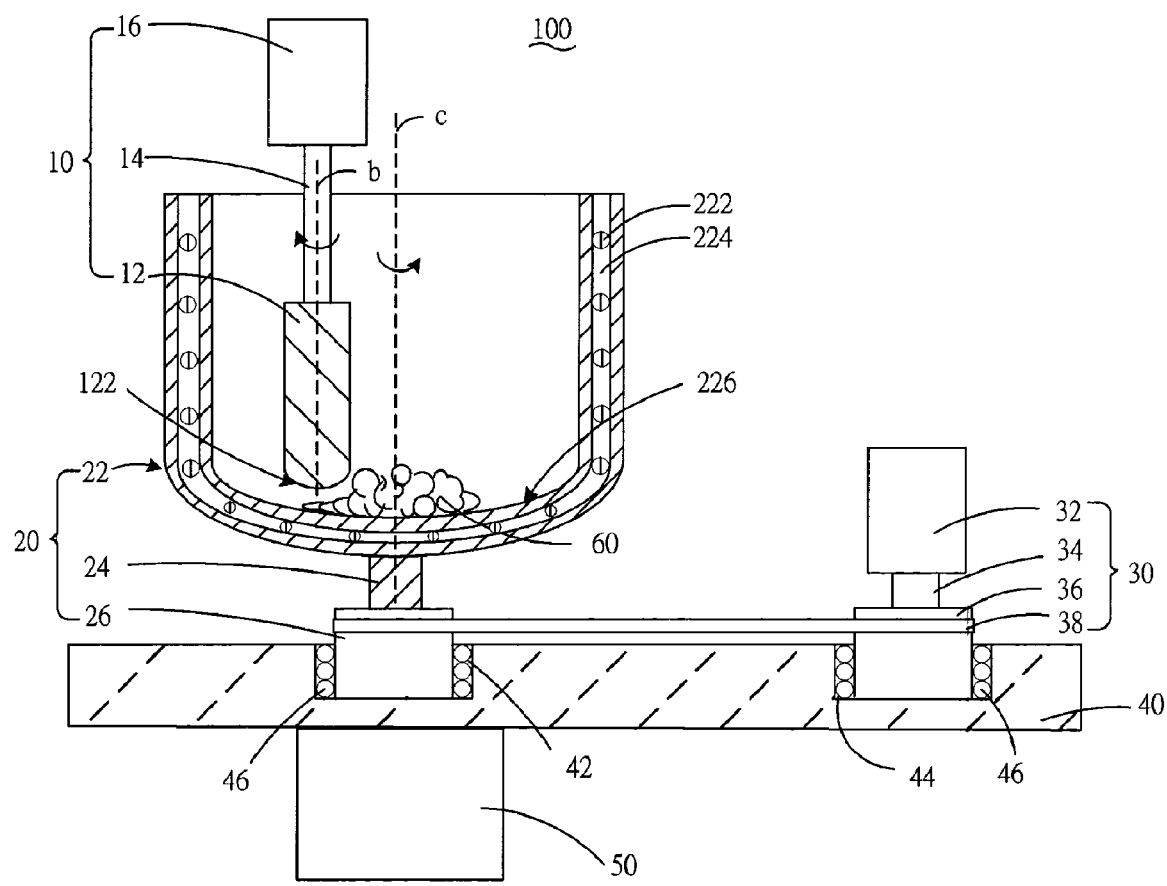
FIG. 1 is a schematic view of a grinding machine, in accordance with a first preferred embodiment.

Reference will now be made to the drawing figures to describe the preferred embodiments of the present grinding machine in detail.

Referring to FIG. 1, a grinding machine 100 in accordance with a first preferred embodiment is shown. The grinding machine 100 includes a grinding unit 10, a receiving unit 20, a transmission unit 30, a base stage 40, and a hydraulic unit 50.

The grinding unit 10 and the receiving unit 20 press against each other and the grinding unit 10 grinds a mixture 60, for example, matrix material and fillers, inside the receiving unit 20. The base stage 40 is configured for supporting the receiving unit 20 and the transmission unit 30.

The grinding unit 10 includes a rotor 12, a first spindle 14, and a first driver 16. The rotor 12 is connected fixedly with the first spindle 14. The rotor 12 has a smooth grinding surface 122 thus preventing the mixture 60 from adhering thereto. The first driver 16 is connected fixedly with the first spindle 14. The first driver 16 drives the rotor 12 to rotate along the first spindle 14. In this embodiment, the rotor 12 only can rotate along an axis labeled with a character b in a first direction.

The receiving unit 20 includes a container 22, a second spindle 24, and a first loading element 26. The second spindle 24 connects fixedly with the container 22 and the second spindle 24 connects fixed with the first loading element 26. The first loading element 26 is cylindrically shaped.

The container 22 includes a heating element 222 contained in a cavity 224 defined by walls of the container 22. The bottom of the wall has a smooth grinding face 226. The grinding surface 122 of the rotor 12 is spherical and has a first curvature. The container 22 has an inner spherical grinding surface with a second curvature. The first curvature is generally configured to be less than the second curvature.

The container 22 receives the rotor 12 therein. The mixture 60 can move to the center of the container 22 under the gravity. The rotor 12 can sufficiently grind the mixture 60 in the container 22. The heating element 222 is arranged in the cavity 224 and is used to heat the internal portion of the container 22 during grinding. Therefore, the mixture 60 may become more viscous, and cannot adhere to the rotor 12. The heating element 222 can be a thermal element (i.e. a resistance wire).

The transmission unit 30 is configured for driving the receiving unit 20 to rotate in a second direction opposite the first direction. The transmission unit 30 includes a second driver 32, a third spindle 34, a second loading element 36, and a transmission belt 38. The third spindle 34 is connected fixedly with the second driver 32 and the second loading element 36. The second loading element 36 is cylindrically shaped. The second loading element 36 is connected with the first loading element 26 through the transmission belt 38. The second driver unit 32 can drive the third spindle 34 to rotate along with the second loading element 36. The transmission belt 38 is driven by the second loading element 36 and thus drives the first loading element 26. The second spindle 24 is driven by the transmission belt 38 and rotates along an axis labeled with a character c in the second direction. The axis c is not coaxially aligned with the axis b. Therefore, the rotor 12 is arranged with its axis offset to the container 22. The transmission belt 38 is a component chosen from the group consisting of a belt and a chain.

The base stage 40 defines a first recess 42 and a second recess 44. The first recess 42 receives the first loading element 26. The radius of the first loading element 26 is smaller than that of the first recess 42. Therefore a ring region is defined between the first recess 42 and the first loading element 26. A number of ball bearings 46 are placed in the ring region to smooth the rotation of the first loading element 26. The second recess 44 is used to receive the second loading element 36. A number of ball bearings 46 are placed between the second recess 44 and the second loading element 36 to smooth the rotation of the second loading element 36.

The hydraulic unit 50 is located at a bottom of the base stage 40. The hydraulic unit 50 can support the receiving unit 20, the transmission unit 30, and the base stage 40 and also can adjust the position of the receiving unit 20 relative to the grinding unit 10 in a direction parallel to the direction of gravity.

The operation of the grinding machine 100 is described in detail below. The second driver unit 32 drives the third spindle 34 and the second loading element 36 to rotate and the first loading element 26, the second spindle 24, and the container 22 rotate along the axis c accordingly. The first driver unit 16 drives the first spindle 14 and the rotor 12 to rotate, the rotor 12 rotates along the axis b. The heating unit 222 heats the container 22, and the mixture 60 is melted. In operation of the grinding machine 100, the hydraulic unit 50 adjusts the position of the rotor 12 and the container 22. The rotor 12 and the container 22 press against each other and the mixture 60 is ground uniformly. The nano-fillers embedded in mixture 60 are mixed until it is evenly distributed throughout the mixture 60. After a period, the grinding machine 100 stops working, the ground mixture 60 is collected, and a next grinding process begins. In the grinding, in order to grind the mixture 60 more uniformly, one of the rotor 12 and container 22 is configured for rotating at a speed of less than 50 revolutions per minute.

Figure 2:
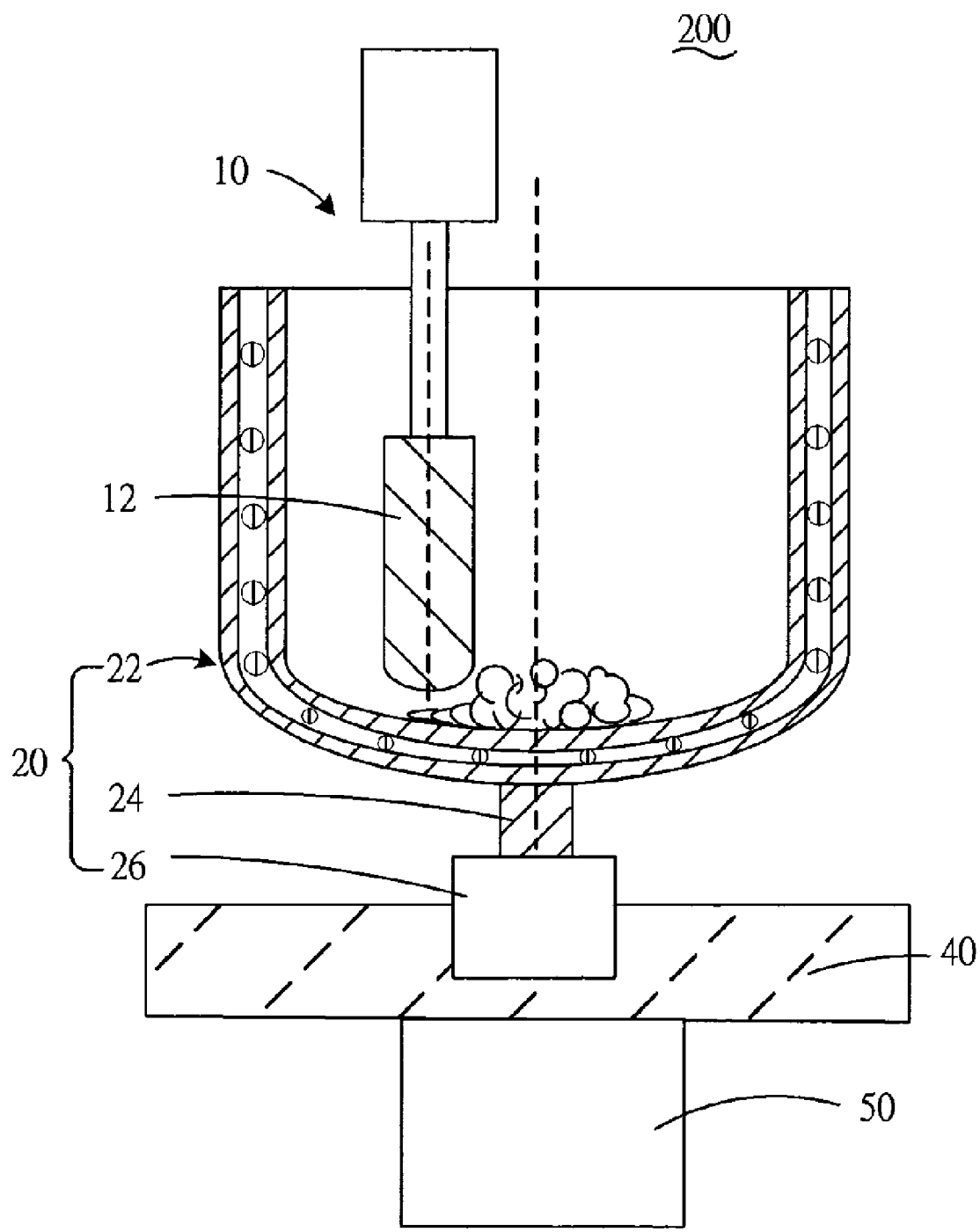
FIG. 2 is a schematic view of a grinding machine, in accordance with a second preferred embodiment.

Referring to FIG. 2, an grinding machine 200 in accordance with a second preferred embodiment is shown. The structure of the grinding machine 200 is similar to that of the grinding machine 100. The grinding machine 200 includes a grinding unit 10, a receiving unit 20, a base stage 40, and a hydraulic unit 50.

The base stage 40 is horizontally movable. The receiving unit 20 mounted on the base stage 40 is horizontally movable, accordingly. The second spindle 24 is connected with the container 22 and the first loading element 26. The container 22 is configured for containing the rotor 12 of the grinding unit 10 and the rotor 12 is arranged with its axis offset from that of the container 22. The rotor 12 can rotate in the container 22 and the container 22 cannot rotate around the second spindle 24. The hydraulic unit 50 is configured for moving the container 22 in the direction of the axis c.

Although the present invention has been described with reference to specific embodiments, it should be noted that the described embodiments are not necessarily exclusive, and that various changes and modifications may be made to the described embodiments without departing from the scope of the invention as defined by the appended claims.

What is claimed is:

1. A grinding machine, comprising:
   a grinding unit including a rotor having a spherical grinding surface, a first spindle having a first end coupled to the rotor, and a first driver unit coupled to an opposite second end of the first spindle, the first driver unit being configured for driving the rotor to rotate relative to a first fixed axis;
   a receiving unit including a container configured for receiving the rotor therein, the container having an inner spherical grinding surface defining a central second fixed axis, the first fixed axis being parallel to and spaced from the second fixed axis; and
   a transmission unit configured for driving the container to rotate relative to the second fixed axis.

2. The grinding machine as claimed in claim 1, wherein the container comprises a heating element.

3. The grinding machine as claimed in claim 1, wherein the container has an inner radius larger than an outer radius of the rotor.

4. The grinding machine as claimed in claim 3, wherein the receiving unit further comprises a cylindrical shaped first support configured for supporting the container.

5. The grinding machine as claimed in claim 4, further comprising a base configured for supporting the receiving unit.

6. The grinding machine as claimed in claim 5, wherein the base defines a first recess configured for receiving the first support, the radius of the first recess is larger than that of the first support thereby defining an annular space between a wall of the first recess and the first support, and a plurality of ball bearings are arranged in the annular space.

7. The grinding machine as claimed in claim 6, wherein the transmission unit comprises a second driver unit, a spindle, and a cylindrical shaped second support connected in series, and a transmission belt encircling the first and second supports.

8. The grinding machine as claimed in claim 7, wherein the base defines a second recess configured for receiving the second support, the radius of the second recess is larger than that of the second support thereby defining an annular space between a wall of the second recess and the second support, and a plurality of ball bearings are arranged in the annular space.

9. The grinding machine as claimed in claim 5, further comprising a hydraulic driving unit configured for moving the container along the second fixed axis.

10. A grinding machine, comprising:
    a grinding member comprising a rotor, the rotor including a spherical grinding surface with a first curvature;
    a first driving unit configured for driving the rotor to rotate relative to a first fixed axis in a first direction;
    a container receiving the grinding member therein, the container including an inner spherical grinding surface with a second curvature, the first curvature of the rotor being less than the second curvature of the container; and
    a second driving unit configured for driving the container to rotate relative to a second fixed axis in a second direction opposite to the first direction, the second fixed axis being parallel to and spaced from the first fixed axis.

11. The grinding machine as claimed in claim 10, wherein the container is movable in a plane perpendicular to the first fixed axis.

12. The grinding machine as claimed in claim 10, wherein the container is movable in a direction of the second fixed axis.

13. The grinding machine as claimed in claim 10, wherein one of the grinding member and the container is configured for rotating at a speed of less than 50 revolutions per minute.

* * * * *